United States Patent
Bacon et al.

(10) Patent No.: US 7,961,052 B2
(45) Date of Patent: Jun. 14, 2011

(54) RF POWER AMPLIFIER INTEGRATED CIRCUIT AND UNIT CELL

(75) Inventors: Peter Bacon, Derry, NH (US); Robert Broughton, Chester, NH (US); Yang Li, Woburn, MA (US); James Bonkowski, Cary, IL (US); Neil Calanca, Crown Point, IN (US)

(73) Assignee: Peregrine Semiconductor Corporation, San Diego, CA (US)

( * ) Notice: Subject to any disclaimer, the term of this patent is extended or adjusted under 35 U.S.C. 154(b) by 36 days.

(21) Appl. No.: 12/589,800

(22) Filed: Oct. 28, 2009

(65) Prior Publication Data

US 2011/0095824 A1    Apr. 28, 2011

(51) Int. Cl.
*H03F 3/14* (2006.01)
(52) U.S. Cl. ................................. 330/307; 330/311
(58) Field of Classification Search .............. 330/307, 330/311
See application file for complete search history.

(56) References Cited

U.S. PATENT DOCUMENTS

| 4,016,643 | A | | 4/1977 | Pucel et al. | |
| 5,990,507 | A | * | 11/1999 | Mochizuki et al. | 257/295 |
| 6,190,957 | B1 | * | 2/2001 | Mochizuki et al. | 438/240 |
| 7,573,768 | B2 | * | 8/2009 | Kang et al. | 365/210.1 |

FOREIGN PATENT DOCUMENTS

| WO | WO2004/086606 A2 | 10/2004 |
| WO | WO2004/095688 A2 | 11/2004 |

OTHER PUBLICATIONS

Tong, Ah Fatt, et al., "RFCMOS Unit Width Optimization Technique", IEEE Transactions on Microwave Theory and Techniques, vol. 55, No. 9, Sep. 2007, pp. 1844-1853.
Schultz, John J., "The Dual-Gate MOSFET", CQ Magazine, Dec. 1968, pp. 30-32.

* cited by examiner

*Primary Examiner* — Henry K Choe
(74) *Attorney, Agent, or Firm* — Jaquez & Associates; Martin J. Jaquez, Esq.; Larry D. Flesner

(57) ABSTRACT

A novel RF power amplifier integrated circuit (PA IC), unit cell, and method for amplifying RF signals are disclosed. One embodiment of a PA IC includes at least two linear arrays comprising transistor device units, and at least one linear array comprising capacitors. The transistor device units include source nodes that are jointly coupled to a source bus, and selected gate nodes that are jointly coupled to a gate bus. First electrodes of the capacitors are also jointly coupled to the source bus, and second electrodes of the capacitors are jointly coupled to the gate bus. Each linear array comprising capacitors is disposed between at least two linear arrays comprising transistor device units. In one embodiment, the PA IC includes unit cells. In some embodiments, each unit cell comprises two transistor device units and one or more capacitors. The capacitors are disposed between the transistor device units. The unit cells are disposed in linear arrays so that the transistor device units are disposed in linear arrays and the capacitors are disposed in linear arrays.

25 Claims, 15 Drawing Sheets

Figure 2 *Prior Art*

RF POWER AMPLIFIER INTEGRATED CIRCUIT AND UNIT CELL

BACKGROUND

1. Field

The present disclosure relates to electronic integrated circuits ("ICs"), and more specifically to RF power amplifiers ("PAs").

2. Description of Related Art

Most radio transceivers, such as cell phones that are a ubiquitous feature of modern life, require an RF PA circuit to boost the transmit signal to a level sufficient to be received by a target transceiver, such as a cellular base station. The performance of the RF power amplifier strongly impacts cell phone features such as battery life, operational range and signal quality. Designs that increase signal quality and transmit power generally increase operational range. However, unless the PA power efficiency is also increased, such designs may negatively impact battery life and cost of the cell phone.

Increases in PA power efficiency generally enable improvements in battery life for a selected level of signal quality and operational range. Because removing waste heat incurs costs, improved efficiency generally reduces the costs incurred by removing waste heat. Power efficiency is thus one aspect of the overall cost efficiency of an RF PA designed for a given level of performance. Other aspects of cost efficiency, such as integrated circuit size and other manufacturing considerations, should be concurrently addressed to result in an RF PA that provides the best overall value to a user.

In order to provide high-power capability, a PA circuit requires transistor circuits wherein the transistors have a large total gate width Wg (i.e., the gate dimension that is perpendicular to current flow). For example, effective gate widths greater than 100 mm may be required to obtain a desired power-handling capability. However, for a transistor to have gain at high RF frequencies, the gate length Lg (i.e., the gate dimension parallel to current flow), must be made very small (typically sub-micrometer). This causes a large gate resistance per unit gate width. Typically, when a single RF transistor's gate width exceeds a few tens of micrometers, or the ratio Wg/Lg is >10, the gate resistance begins to degrade the performance of the transistor. To overcome this problem, PA IC designers employ circuits having a plurality of shorter gate-width transistors operably coupled in parallel. A first method of implementing parallel transistor circuits uses interdigitated transistor devices. One exemplary reference relating to interdigitated RF transistors is a technical paper entitled "RFCMOS Unit Width Optimization Technique," A. F. Tong, et al., IEEE Transactions on Microwave Theory and Techniques, Vol. 55, No. 9, September 2007. This reference is hereby fully incorporated by reference herein, as though set forth in full, for its teachings on interdigitated transistors. A second method of implementing parallel transistor circuits is implemented by connecting transistor devices (which may be interdigitated) in parallel via interconnects and bus lines. Using these methods, PA ICs can be fabricated using a plurality of transistors having small gate lengths and widths, coupled in parallel circuits to provide a power-handling capability corresponding to the sum of the gate widths of the plurality of transistors. To increase voltage handling capability, series circuits of transistors are also employed.

When transistor devices are coupled together in order to increase the power-handling capability of PA ICs, attention must be given to minimizing the parasitic resistances and capacitances caused by interconnects and bus lines. Novel PA ICs are needed to reduce such parasitic resistances and capacitances, thereby providing improvements in power efficiency. Novel PA ICs that provide improvements in removing heat generated by the plurality of transistor devices are needed. Further, novel PA ICs that reduce the overall size of PA ICs, providing improved economy of fabrication are needed. The teachings hereinbelow disclose novel PA ICs and methods of RF amplification that provide solutions to the above-described problems.

SUMMARY

A novel RF power amplifier (PA) integrated circuit (IC), unit cell and method for amplifying RF signals are disclosed. One embodiment of a PA IC made in accordance with the present teachings includes at least two linear arrays comprising transistor device units, and at least one linear array comprising capacitors. The transistor device units include source nodes jointly coupled to a source bus, and selected gate nodes jointly coupled to a gate bus. First electrodes of the capacitors are also jointly coupled to the source bus, and second electrodes of the capacitors are jointly coupled to the gate bus. Each linear array comprising capacitors is disposed between at least two linear arrays comprising transistor device units.

In one embodiment, the PA IC includes unit cells. Each unit cell comprises two transistor device units and one or more capacitors. The capacitors are disposed between the transistor device units. The unit cells are disposed in linear arrays so that the transistor device units are disposed in linear arrays and the capacitors are disposed in linear arrays.

The capacitors may include, without limitation: metal-insulator-metal (MIM) capacitors, metal-oxide-semiconductor (MOS) capacitors, vertical native capacitors (VNCAPs), or a combination thereof.

In some embodiments, a transistor device unit includes a plurality of transistor sub-units. The sub-units may be coupled together in parallel circuits, in series circuits, or a combination of series and parallel circuits. A sub-unit includes two or more transistors coupled together in a series circuit. The transistor device unit and/or the sub-units may comprise interdigitated transistors.

In some embodiments, a unit cell includes a plurality of capacitors disposed between two transistor device units. For example, a unit cell may include a capacitor C1 and a capacitor C2. A first electrode of the capacitor C1 is coupled to source nodes SN of the transistor device units, and a second electrode of the first capacitor is coupled to gate nodes GN2 of the transistor device units. A first electrode of the capacitor C2 is coupled to the source nodes SN, and a second electrode of the second capacitor is coupled to gate nodes GN3 of the transistor device units. The transistor device units may include gate nodes GN1 that are not coupled to the capacitors C1 and C2.

In one embodiment of the PA IC, source buses are disposed on top of the linear arrays of capacitors. In one embodiment, the source buses may be implemented as a contiguous cap metal layer coupled to first electrodes of the capacitors. In some embodiments, gate buses coupled to the capacitors are disposed on the bottom of the linear arrays of capacitors. Drain nodes of the transistor device units are coupled to a drain bus, and the drain bus may be disposed on top of transistors within the transistor device units. Gate buses that are not electrically coupled to the capacitors may be disposed between unit cells to reduce proximity to the drain bus and the capacitors.

In one embodiment, contact pads for conveying heat and/or signal voltages and/or bias voltages are disposed on top of the capacitors. In other embodiments, the contact pads are disposed within or proximate to the unit cells, and may be contiguous with the IC substrate or other structures. The contact pads may be implemented as wire bond pads, or as pads for flip chip mounting. Flip chip mounting techniques in accordance with the present disclosure include, without limitation: solder bumps, gold balls, and Cu pillars.

In one embodiment, the PA IC may be implemented using high-resistivity (e.g., resistivity >10 ohm-cm) or silicon-on-insulator (SOI) substrates. Substrates in accordance with the present disclosure include, without limitation: silicon-on-sapphire (SOS), SIMOX, and silicon-on-glass.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

A novel RF power amplifier (PA) integrated circuit (IC), unit cell, and method for amplifying RF signals are described. In accordance with the present disclosure, embodiments of transistor device units are described. Embodiments for improved unit cells are described. Improved PA ICs incorporating the improved unit cells are described. Embodiments for improved bus layouts are described. Embodiments for disposing contact pads in PA ICs are described. Exemplary materials and methods of fabrication are also described.

Figure 1:
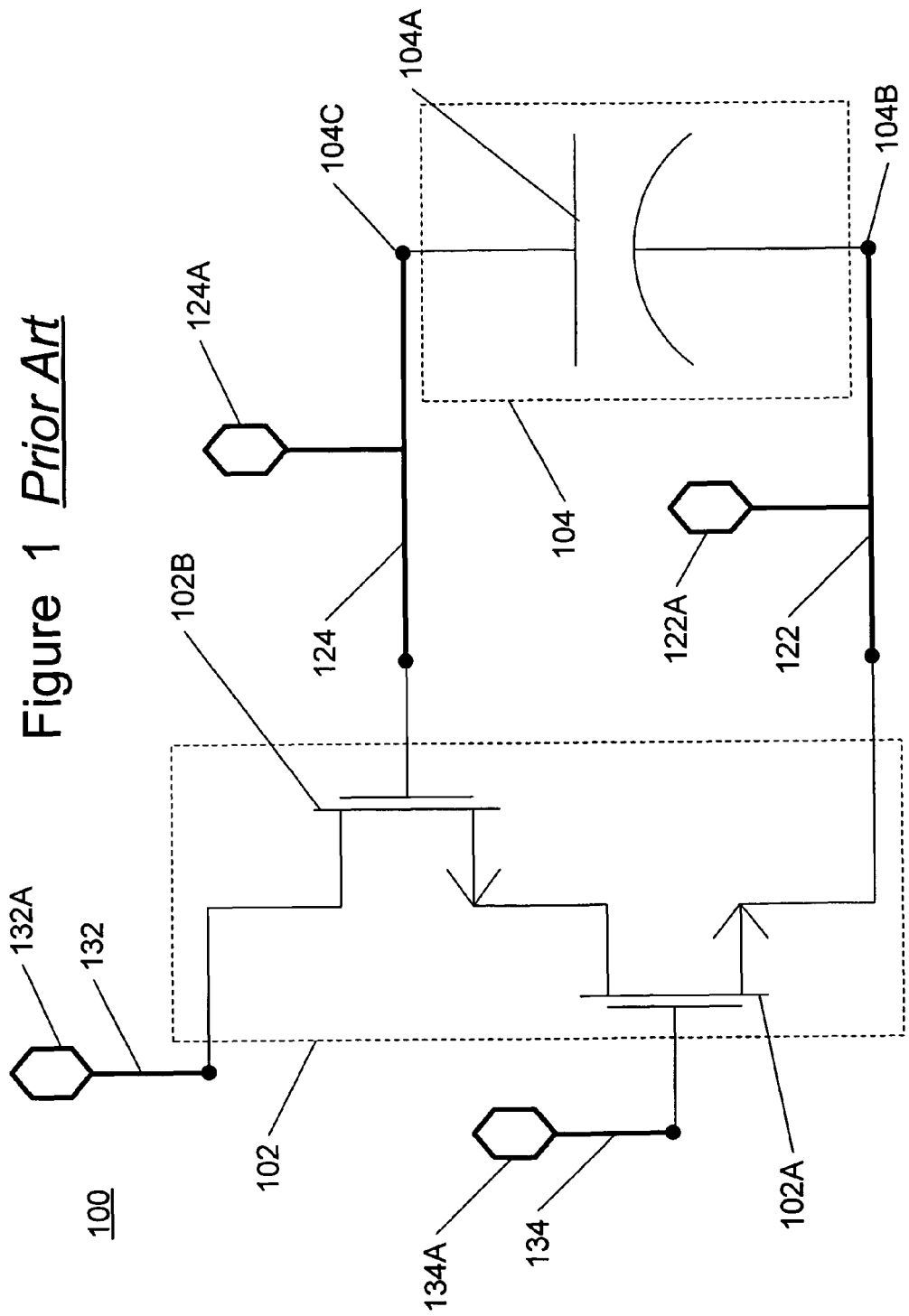
FIG. 1 is a simplified schematic diagram of a prior art power amplifier circuit.

FIG. 1 is a simplified schematic diagram of a PA 100. The schematic of the PA 100 shows a cascode amplifier circuit. Cascode amplifier circuits are well known to persons skilled in the arts of electronic amplifiers. Transistors 102A and 102B are operably coupled in series to comprise a transistor device unit 102. For simplicity, a single transistor device unit 102 is shown in the schematic diagram of FIG. 1. However, those skilled in the arts of PA IC design will understand that the PA 100 may include a plurality of transistor device units (not shown) operably coupled together in parallel and/or series.

A capacitor unit 104 includes a capacitor 104A. For simplicity, only one capacitor 104A is shown. However, those skilled in the PA IC design arts will understand that the capacitor unit 104 may include a plurality of capacitors (not shown) operably coupled together in parallel and/or series circuit.

A source electrode of the transistor 102A is operably coupled to a bus 122. The bus 122 is operably coupled to a first electrode 104B of the capacitor 104A. The bus 122 is also operably coupled to an electrical contact 122A that is typically coupled to a ground potential. More generally, the electrical contact 122A is coupled to a potential less than the potential of electrical contact 132A.

A gate electrode of the transistor 102B is operably coupled to a bus 124. The bus 124 is operably coupled to a second electrode 104C of the capacitor 104A. The bus 124 is also operably coupled to an electrical contact 124A that typically conveys a bias voltage. A gate electrode of the transistor 102A is operably coupled to a bus 134. The bus 134 is also operably coupled to an electrical contact 134A that conveys signal voltages and/or bias voltages. A drain electrode of the transistor 102A is operably coupled to a bus 132. The bus 132 is also operably coupled to the electrical contact 132A that conveys signal voltages and/or bias voltages.

Figure 2:
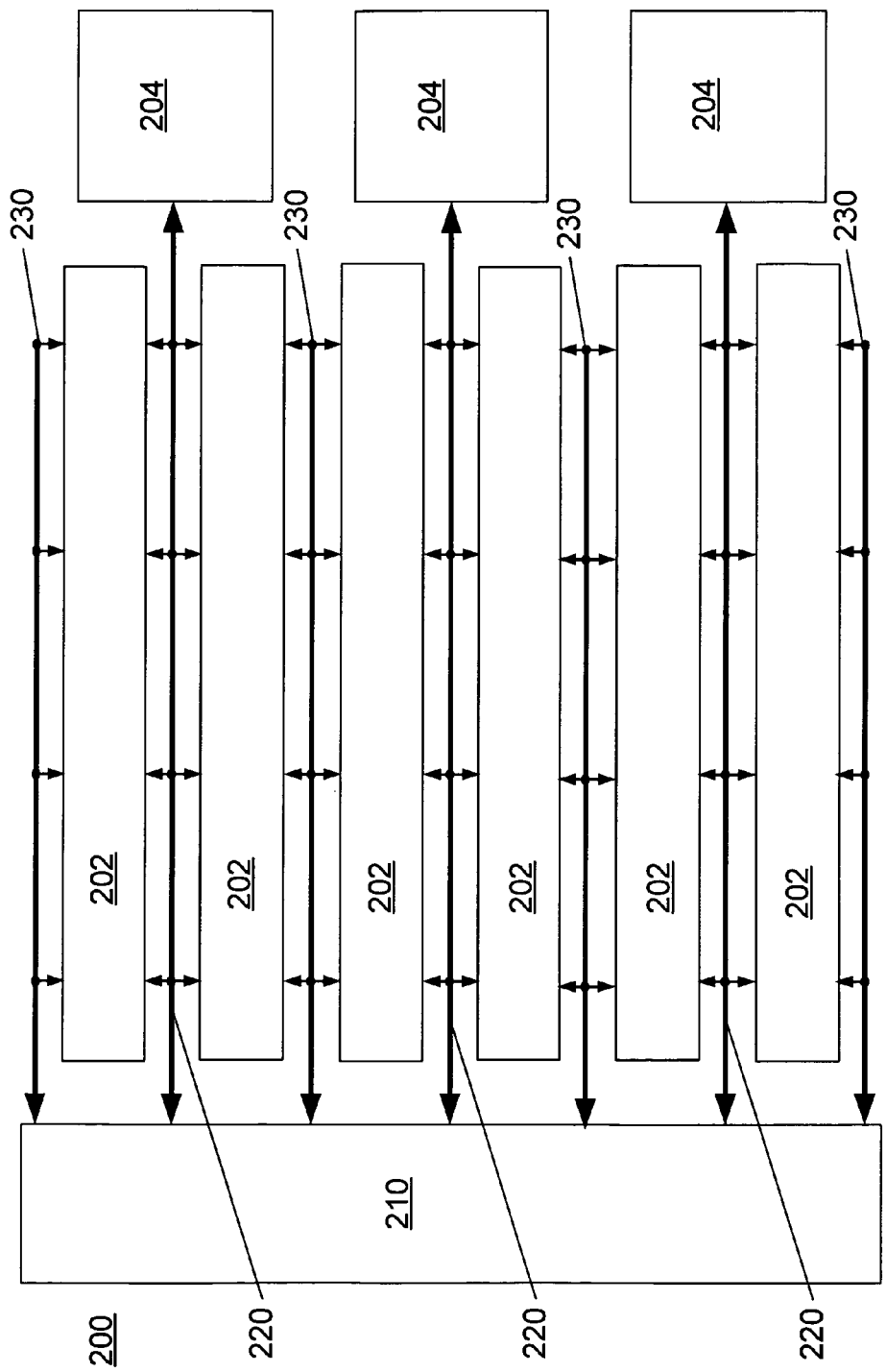
FIG. 2 is a block diagram illustrating a simplified integrated circuit layout for the prior art power amplifier of FIG. 1.

FIG. 2 is a block diagram illustrating a simplified IC layout 200 of the prior art PA 100 (FIG. 1). Transistor device blocks 202 each include one or more transistor device units (not shown) corresponding to the transistor device unit 102 of FIG. 1. The transistor device units (not shown) within the blocks 202 are operably coupled together via buses 220 and 230. The buses 220 include the buses 122 and 124 of the FIG. 1. The buses 230 include the buses 132 and 134 of FIG. 1.

Capacitor unit blocks 204 each include one or more capacitor units (not shown) corresponding to the capacitor unit 104 of FIG. 1. The capacitor units (not shown) within the blocks 204 are operably coupled to the transistor device units (not shown) within the blocks 202 via the buses 230. A bias and signal block 210 includes bias sources (not shown) and signal input/output (I/O) contacts (not shown). The bias sources and I/O contacts of the block 210 are operably coupled to the transistor device units (not shown) of the blocks 202 and the capacitor units (not shown) of the blocks 204 via the buses 220 and 230.

The prior art PA 100 and PA IC layout 200 have various disadvantages. First (referring to FIG. 2), because the transistor device blocks 202 are disposed in proximity to each other, and separated only as required to accommodate the bus lines 220 and 230, the heat generated by the transistor device units (not shown) is concentrated within a limited area. The localized temperature of the IC in the vicinity of the PA device is thereby increased and the performance of the transistor device units is degraded. Second, because the capacitors (not shown) within the blocks 204 are separated from the transistors within the blocks 202, parasitic resistances result from the connections via the buses 220. These parasitic resistances reduce the power added efficiency of the prior art PA IC. Third, parasitic capacitances between sources, gates and drains of the transistors (not shown) within the blocks 202 occur because of proximity to the buses 220 and 230. These parasitic capacitances also reduce the power added efficiency of the prior art PA IC. These disadvantages of the prior art approaches are overcome according to the present teachings.

Transistor Device Units in Accordance with the Present Teachings

Figure 3:
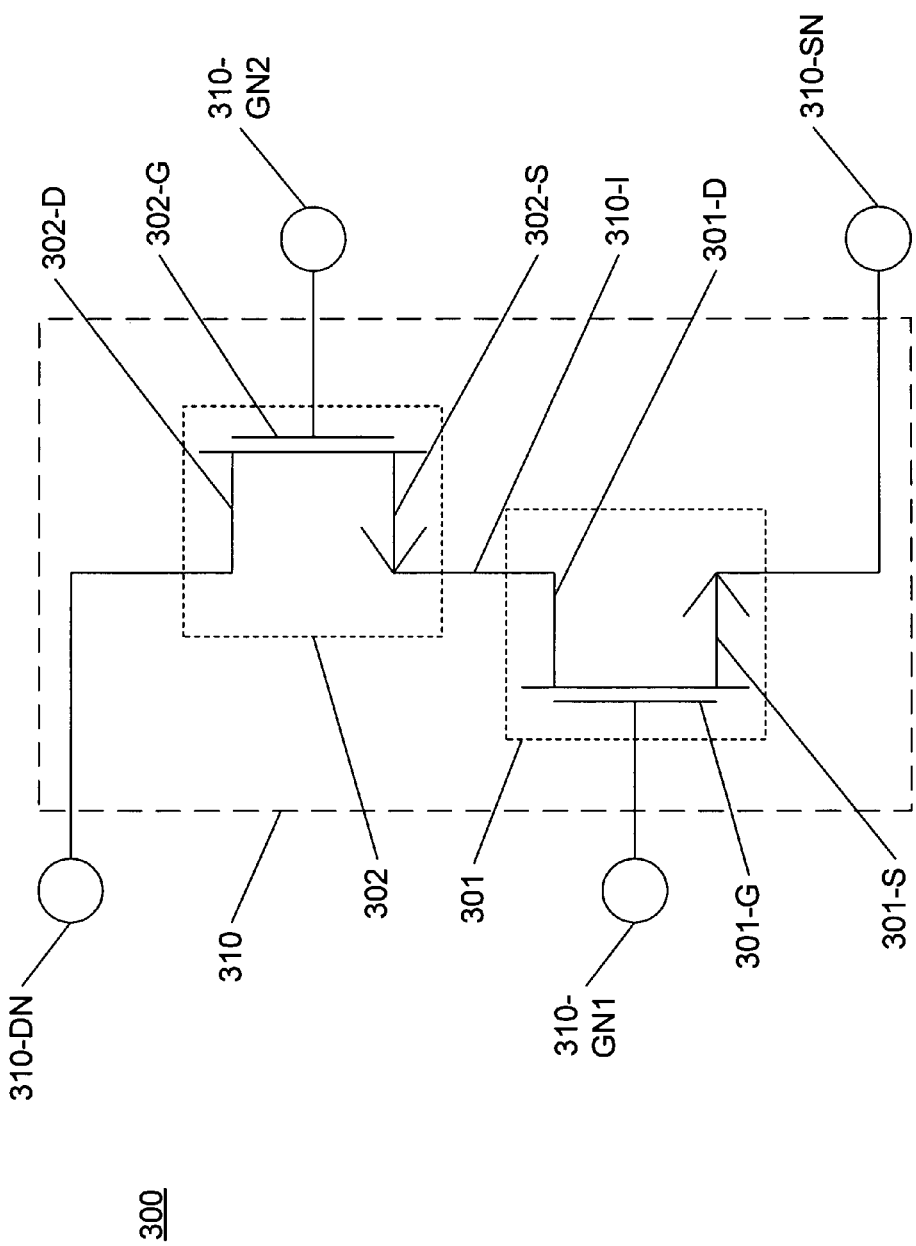
FIG. 3 is a schematic circuit diagram illustrating a transistor device unit in accordance with the present disclosure.

FIG. 3 is a schematic diagram illustrating a transistor device unit 300, in accordance with the present teachings. A transistor area 310 includes components of transistors 301 and 302. The transistor 301 includes a source 301-S, a gate 301-G, and a drain 301-D. The source 301-S is operably coupled to a source node 310-SN. The gate 301-G is operably coupled to a gate node 310-GN1. The transistor 302 includes a source 302-S, a gate 302-G, and a drain 302-D. The drain 302-D is operably coupled to a drain node 310-DN. The gate 302-G is operably coupled to a gate node 310-GN2. The source 302-S is operably coupled to the drain 301-D by an interconnecting structure 310-I as described hereinbelow.

Figure 4:
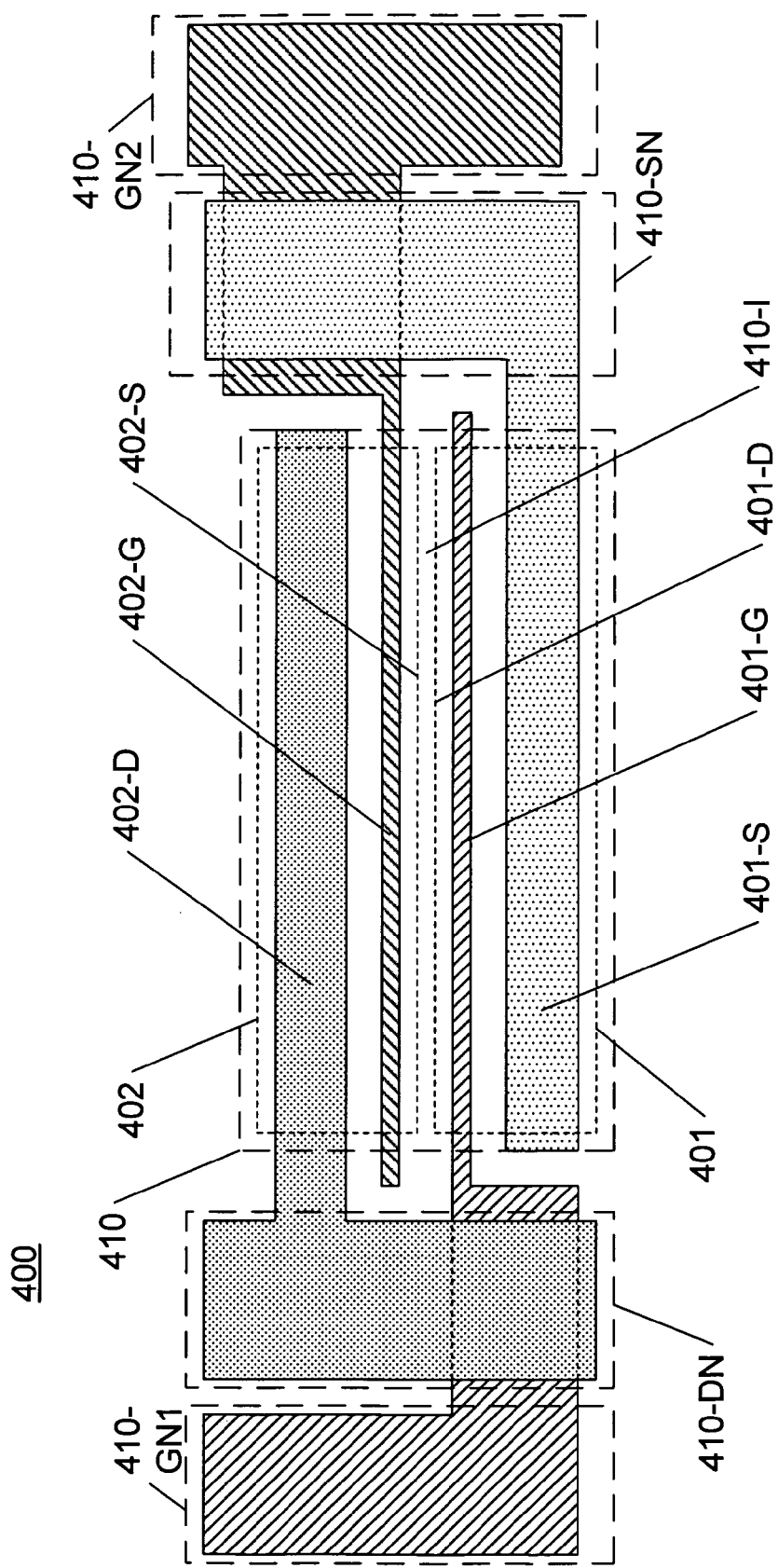
FIG. 4 is a diagram showing a transistor device unit layout in accordance with the transistor device unit of FIG. 3.

FIG. 4 is a simplified block diagram showing an embodiment of the transistor device unit 300 (FIG. 3), implemented as a transistor device unit layout 400 on a semiconductor. The transistor device unit layout 400 may be implemented using standard IC fabrication methods that are well-known to persons skilled in the IC fabrication arts. An example of IC fabrication methods and materials is described in detail in the "Method of Fabrication" section set forth below, in relation to silicon-on-insulator (SOI) ICs. Embodiments of the present disclosure using SOI ICs are advantageous because of the superior properties of SOI for high-power, high-frequency RF PAs, as described in detail hereinbelow in the "Method of Fabrication" section.

Referring to FIG. 4, a transistor area 410 includes components of transistors 401 and 402, corresponding to the transistors 301 and 302 shown in FIG. 3. As shown in FIG. 4, transistor 401 includes a source contact 401-S, a gate contact 401-G, and a drain region 401-D. The source contact 401-S is operably coupled to a source node 410-SN. The gate contact 401-G is operably coupled to a gate node 410-GN1. The transistor 402 includes a source region 402-S, a gate contact 402-G, and a drain contact 402-D. The drain contact 402-D is operably coupled to a drain node 410-DN. The gate contact 402-G is operably coupled to a gate node 410-GN2. The source region 402-S is operably coupled to the drain region 401-D via an interconnecting semiconductor region 410-I (corresponding to the interconnecting structure 310-I of FIG. 3). By operably coupling the source region 402-S to the drain region via the interconnecting semiconductor region 410-I, an external source-drain contact is eliminated, thereby reducing die area and fabrication cost.

Figure 5:
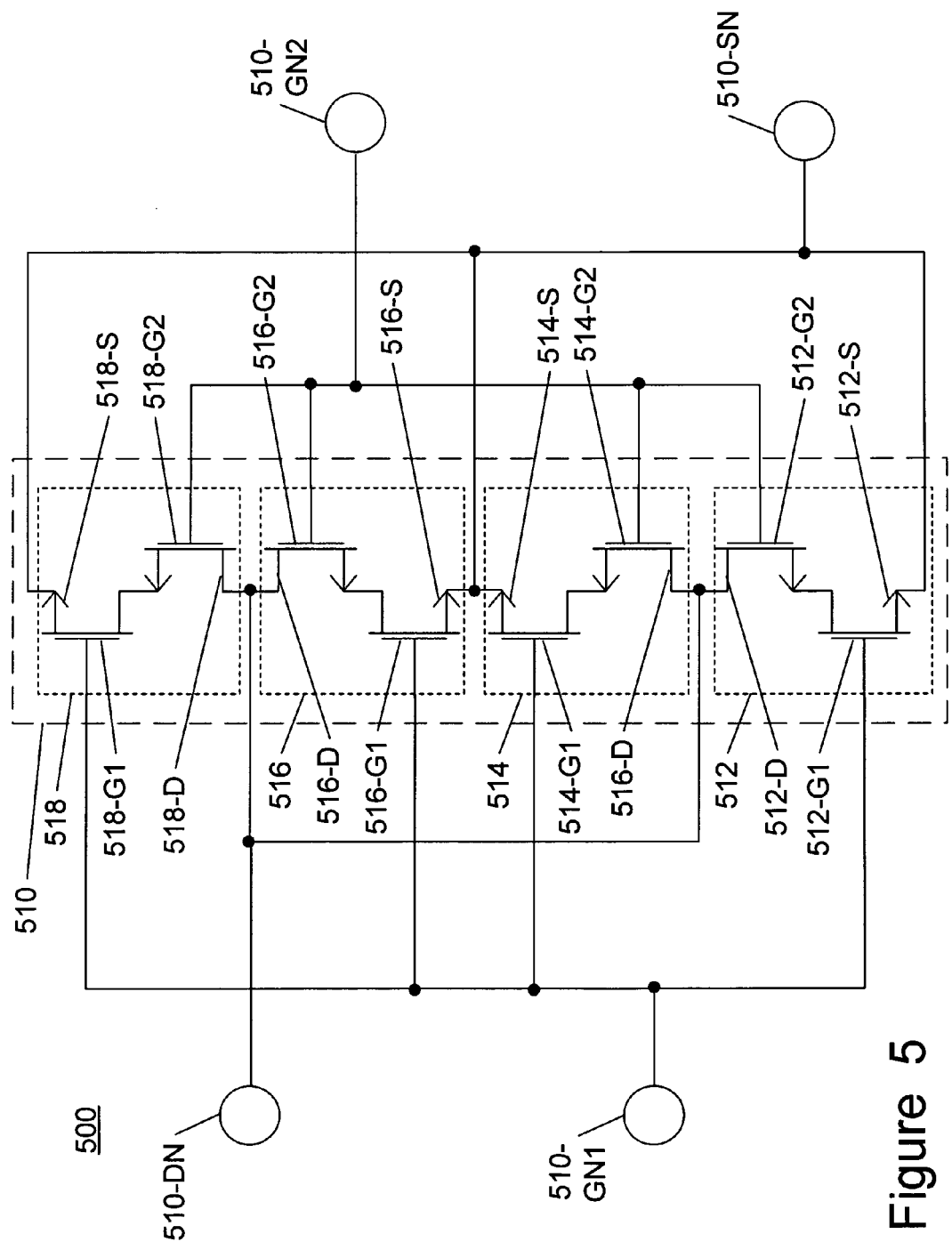
FIG. 5 is a schematic circuit diagram illustrating a transistor device unit that includes a plurality of sub-units.

FIG. 5 is a schematic diagram illustrating a transistor device unit 500. A transistor area 510 includes components of four sub-units 512, 514, 516 and 518. Each of the four sub-units 512-518 is schematically equivalent to the transistor device unit 300 (shown in FIG. 3). Although only four sub-units are illustrated in FIG. 5, persons skilled in the IC design arts will understand from the present teachings that a transistor device unit may include an arbitrary plurality of sub-units.

The four sub-units 512-518 are operably coupled together in a parallel circuit. Transistor sources 512-S, 514-S, 516-S and 518-S are jointly operably coupled to a source node 510-SN. Transistor drains 512-D, 514-D, 516-D and 518-D are jointly operably coupled to a drain node 510-DN. Transistor gates 512-G1, 514-G1, 516-G1 and 518-G1 are jointly operably coupled to a gate node 510-GN1. Transistor gates 512-G2, 514-G2, 516-G2 and 518-G2 are jointly operably coupled to a gate node 510-GN2.

Figure 6:
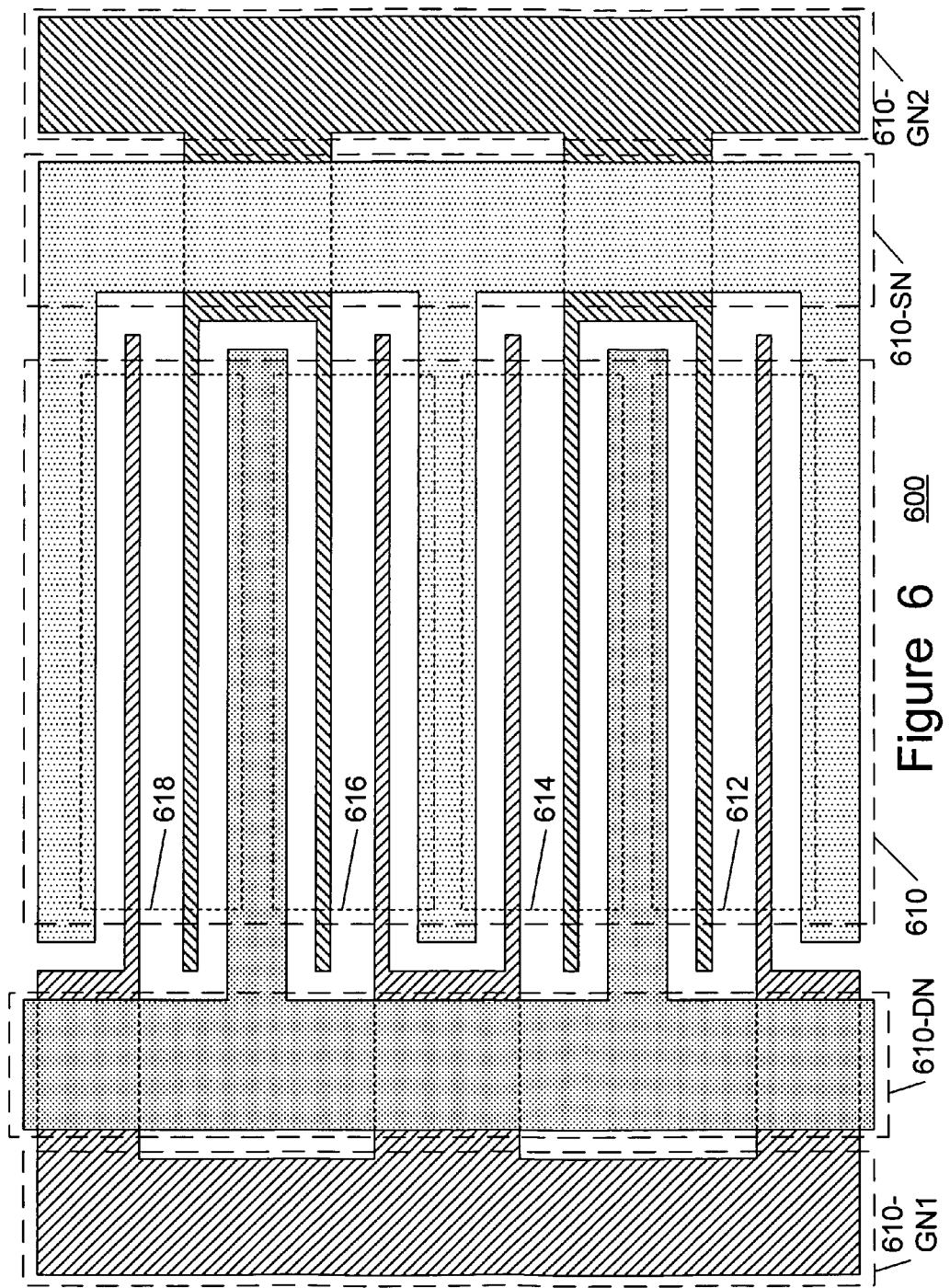
FIG. 6 is a diagram showing a transistor device unit in accordance with the transistor device unit of FIG. 5.

FIG. 6 is a simplified block diagram showing an embodiment of the transistor device unit 500 (FIG. 5) implemented as a transistor device unit layout 600 on a semiconductor. A transistor area 610 includes components of four sub-units 612, 614, 616 and 618, corresponding to the sub-units 512, 514, 516 and 518 of the FIG. 5. For clarity, the transistors and transistor components included in the sub-units 512-518 are not labeled. Identification of the transistors and transistor components of the sub-units 512-518 is obvious to persons skilled in the arts of electronic devices, particularly in light of the description set forth hereinabove in reference to the FIGS. 3, 4 and 5.

The four sub-units 612-618 are operably coupled together in parallel. As shown in FIG. 6, the four sub-units 612-618 are operably coupled to a source node 610-SN, a drain node 610-DN, a first gate node 610-GN1 and a second gate node 610-GN2. The source node 610-SN corresponds to the source node 510-SN of FIG. 5. The drain node 610-DN corresponds to the source node 510-DN of FIG. 5. The gate node 610-GN1 corresponds to the gate node 610-GN1 of FIG. 5. The gate node 610-GN2 corresponds to the gate node 610-GN2 of FIG. 5. The transistor device units 500 and 600, described in reference to FIGS. 5 and 6, respectively, include four sub-units operably coupled together in parallel. More generally, persons skilled in the IC design and fabrication arts will understand that transistor device units made in accordance with the present teachings may include arbitrary pluralities of sub-units operably coupled together in parallel.

Figure 7:
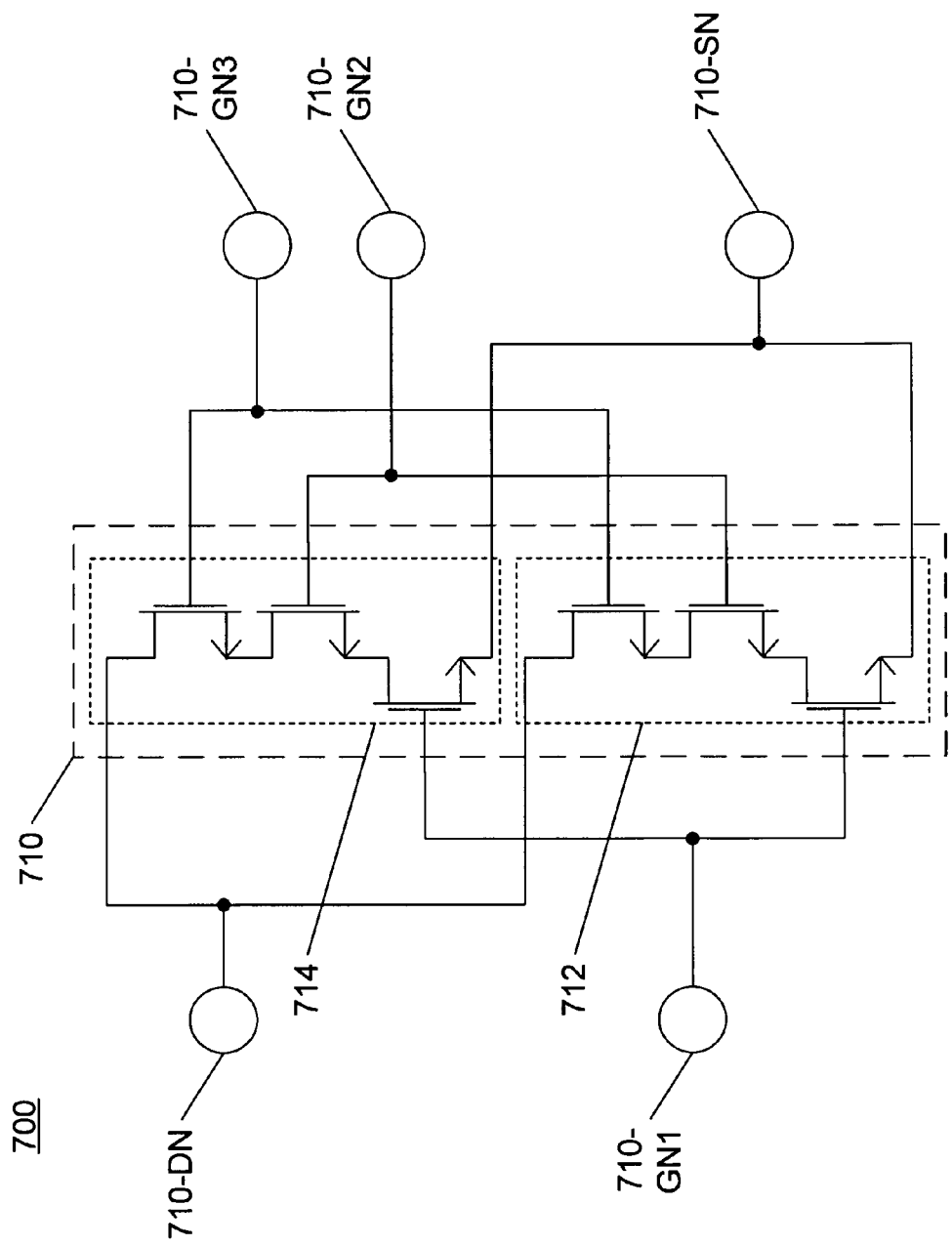
FIG. 7 is a schematic diagram showing a transistor device unit including two sub-units.

The embodiments described above in reference to FIGS. 3-6 illustrate transistor device units and sub-units in which two transistors are operably coupled in series. More generally, the scope of the present teachings may include transistor device units and sub-units with an arbitrary plurality of transistors operably coupled in series. For example, FIG. 7 is a schematic showing a transistor device unit 700 including two sub-units 712 and 714. Each sub-unit 712 and 714 includes three transistors (not labeled) operably coupled in series. The sub-units 712 and 714 are coupled in parallel. A transistor source (not labeled) of each sub-unit 712 and 714 is coupled to a source node 710-SN. A transistor drain (not labeled) of each sub-unit 712 and 714 is coupled to a drain node 710-DN. A first gate node (not labeled) of each sub-unit 712 and 714 is coupled to a first gate node 710-GN1. A second gate node (not labeled) of each sub-unit 712 and 714 is coupled to a second gate node 710-GN2. A third gate node (not labeled) of each sub-unit 712 and 714 is coupled to a third gate node 710-GN3.

A layout diagram for the transistor device unit 700 is not illustrated herein and therefore is not described. However, those skilled in the IC design and fabrication arts will understand how the device unit 700 may be embodied in an IC, particularly in view the teachings set forth above with reference to FIGS. 3-6.

Improved Unit Cells

As used herein, the term "unit cell" refers to an electronic circuit component that may be replicated in a linear or two-dimensional array within an integrated circuit. According to prior art designs, as described above with reference to FIGS. 1 and 2, a unit cell includes one or more transistor device units (e.g., the transistor device unit 102 of FIG. 1). The prior art unit cell does not include capacitors (e.g., the capacitor 104A of FIG. 1) that are coupled via buses (e.g., the buses 122 and 124 of FIG. 1) to selected sources and gates of the transistor device units comprising the unit cell. This is further indicated by the FIG. 2, wherein the capacitor unit blocks 204 are operably coupled via the buses 220 to the transistor device blocks 202. The transistor device blocks 202 include a plurality of unit cells (not shown), each of which includes one or more transistor device units (not shown).

Figure 8:
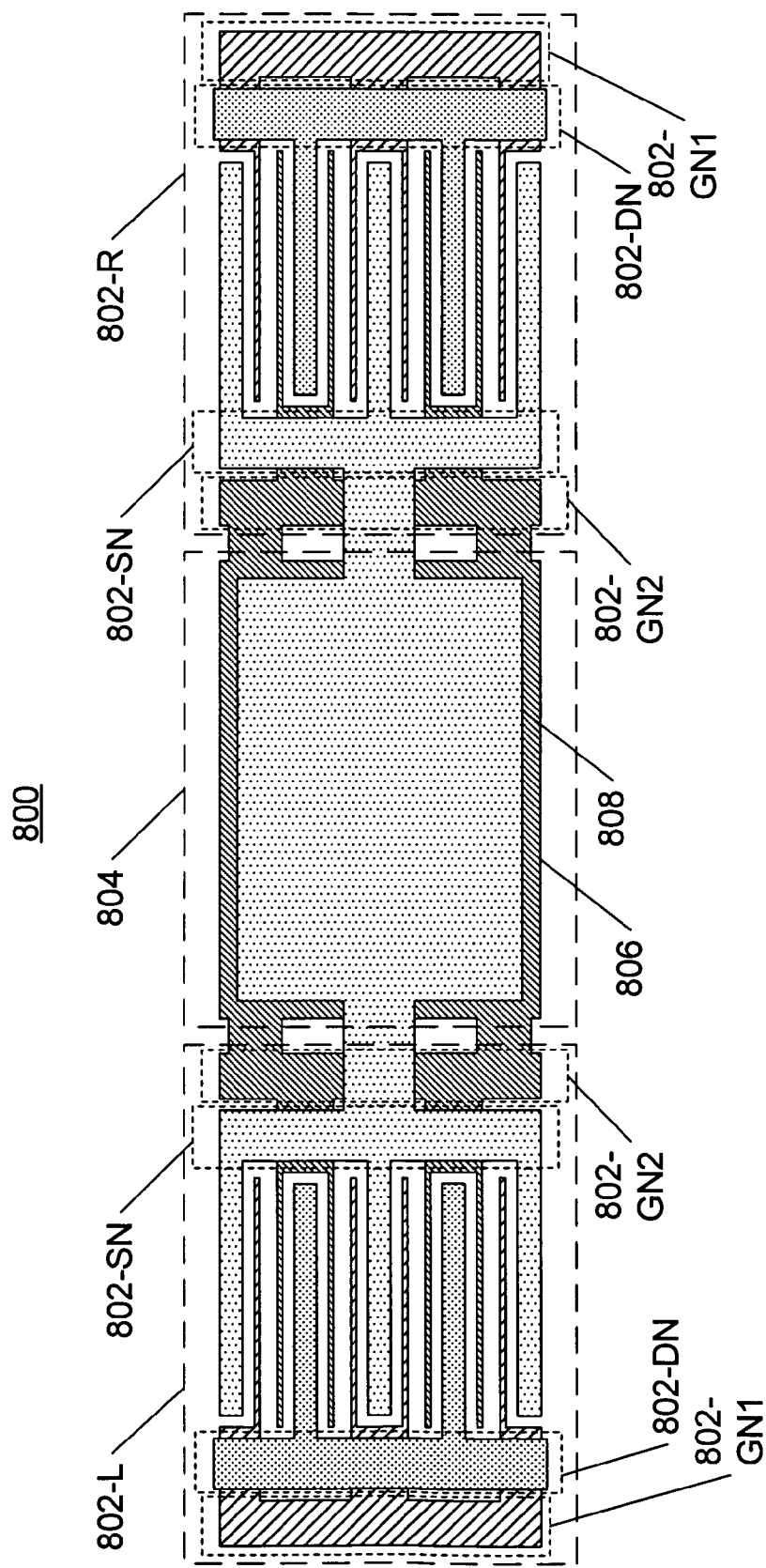
FIG. 8 is a diagram showing a layout for a unit cell, in accordance with the present disclosure.

One embodiment of an improved unit cell 800, in accordance with the present disclosure, is illustrated by the simplified layout diagram of FIG. 8. The improved unit cell 800 includes two transistor device units 802-L and 802-R. The transistor device units 802-L and 802-R are identical to each other, and to the transistor device unit 600 of FIG. 6. The transistor device unit 802-L is rotated by 180 degrees or mirrored with respect to the transistor device unit 802-R.

As shown in FIG. 8, a capacitor 804 is disposed between the transistor device units 802-L and 802-R. A top electrode 808 of the capacitor 804 is coupled to two source nodes 802-SN. The source nodes 802-SN are each equivalent to the source node 510-SN (FIG. 5) and the source node 610-SN (shown in FIG. 6). A bottom electrode 806 of the capacitor 804 is coupled to two gate nodes 802-GN2. The gate nodes 802-GN2 are each equivalent to the gate node 510-GN2 (shown in FIG. 5) and the gate node 610-GN2 (shown in FIG. 6). According to one embodiment, the capacitor 804 may comprise a metal-insulator-metal capacitor. In another embodiment, the capacitor may comprise a metal-oxide-semiconductor (MOS) capacitor.

The improved unit cell 800 includes two drain nodes 802-DN. Each of the two drain nodes 802-DN are separately equivalent to the drain node 510-DN (shown in FIG. 5) and the drain node 610-DN (shown in FIG. 6). The improved unit cell 800 also includes two gate nodes 802-GN1. Each of the two gate nodes 802-GN1 are separately equivalent to the gate node 510-GN1 (shown in FIG. 5) and the gate node 610-GN1 (shown in FIG. 6). The source nodes 802-SN, the drain nodes 802-DN, the gate nodes 802-GN1 and the gate nodes 802-GN2 may be coupled to bus lines (not shown) that convey signal and/or bias voltages.

Figure 9:
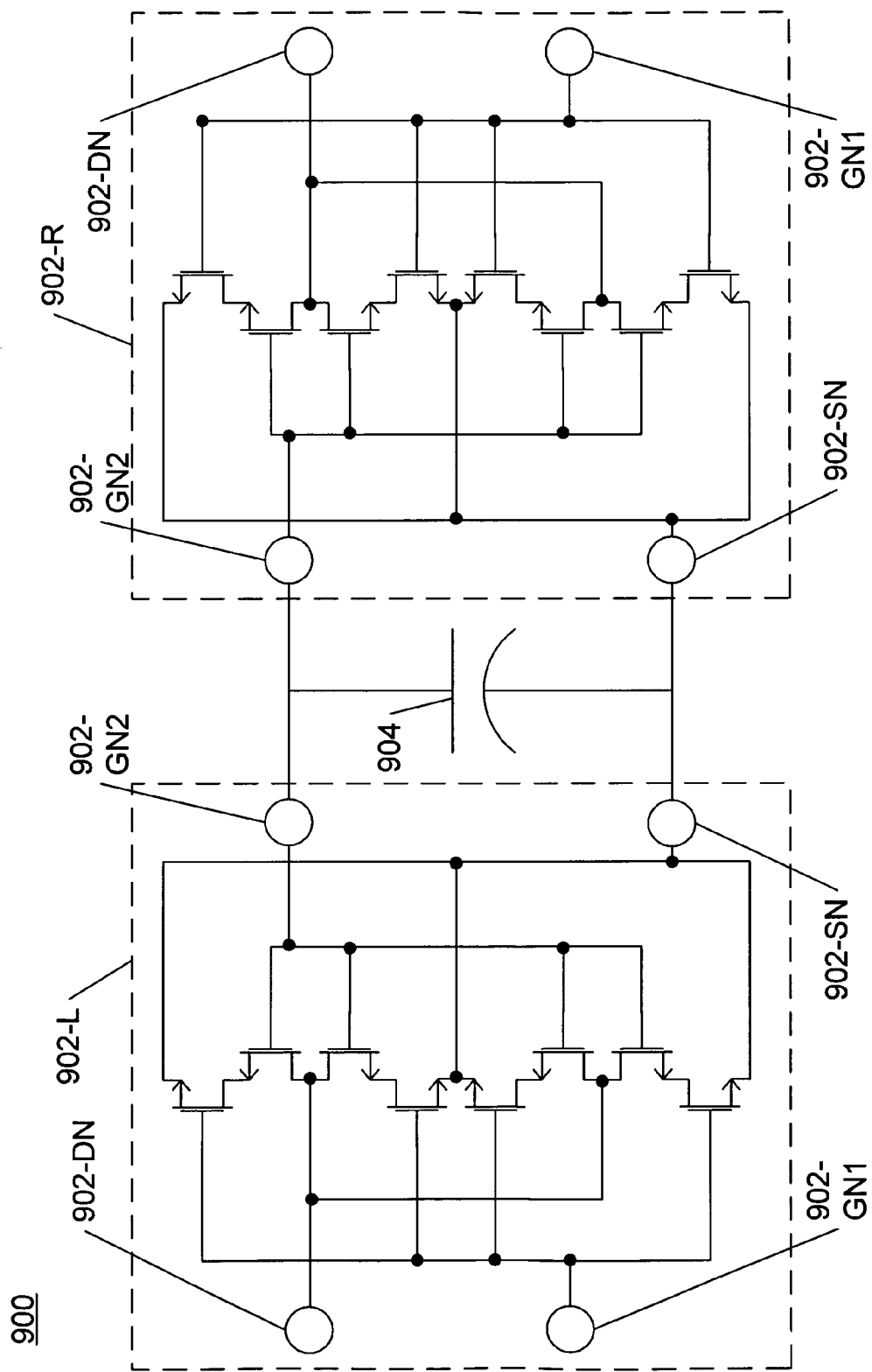
FIG. 9 is a schematic circuit diagram of a unit cell in accordance with the unit cell of FIG. 8.

FIG. 9 shows a schematic circuit diagram of an improved unit cell 900 corresponding to the improved unit cell 800 depicted in the layout diagram of FIG. 8. The transistor device units 902-L and 902-R correspond to the transistor device units 802-L and 802-R of FIG. 8. A first node of a capacitor 904 is coupled to two source nodes 902-SN. A second node of the capacitor 904 is coupled to two gate nodes 902-GN2. The improved unit cell 900 also includes two drain nodes 902-DN and two gate nodes 902-GN1. The source nodes 902-SN, the drain nodes 902-DN, the gate nodes 902-GN1, and the gate nodes 902-GN2 may be coupled to buses (not shown) that convey signal and/or bias voltages.

Figure 10:
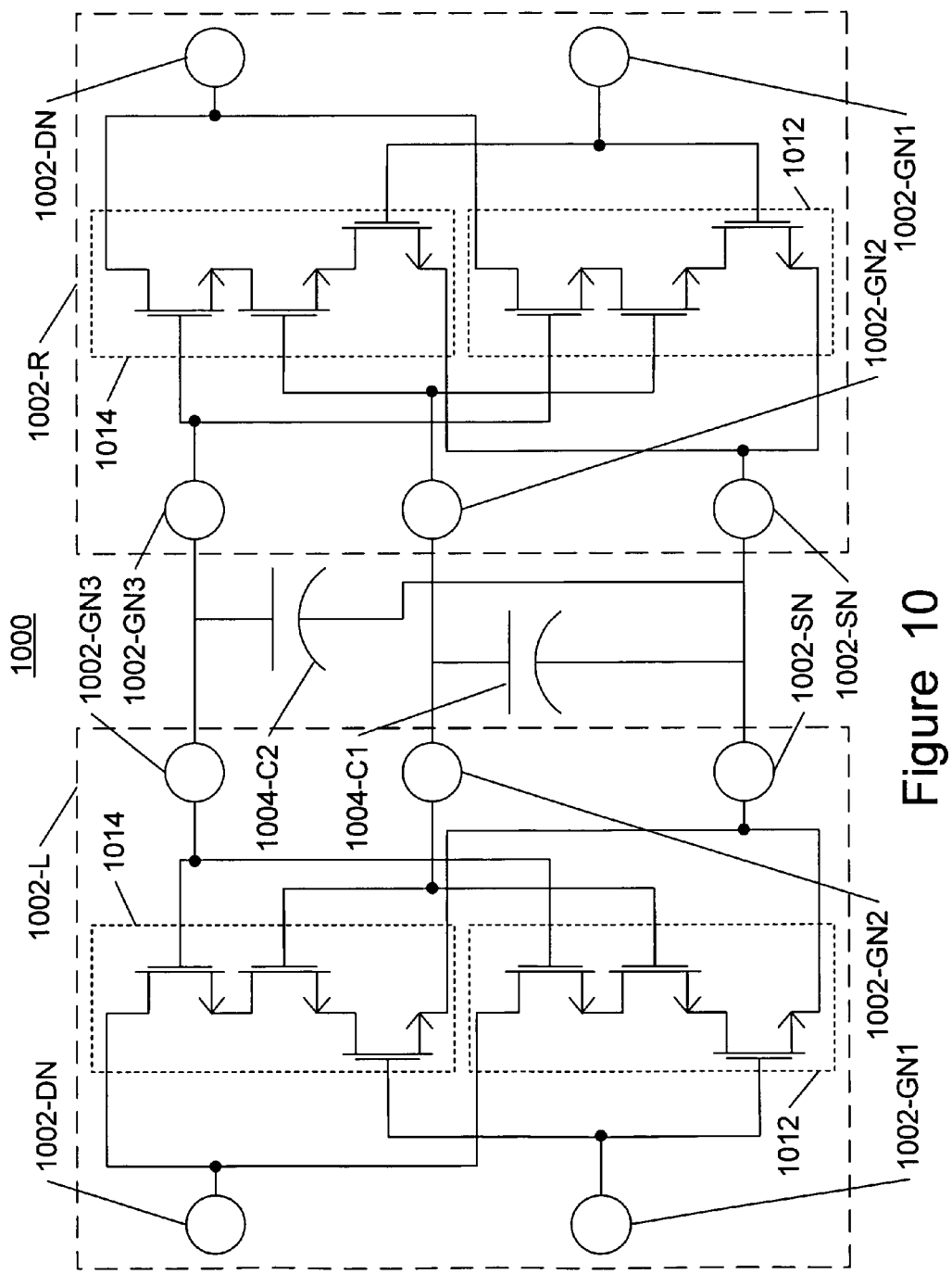
FIG. 10 is a schematic circuit diagram of a unit cell that includes two transistor device units and two capacitors.

In other embodiments, improved unit cells according to the present disclosure may include one or more transistor device units (and/or sub-units) each having three or more transistors operably coupled together in series, and an arbitrary number of capacitors. As an example, FIG. 10 shows a schematic of another embodiment of an improved unit cell 1000. As shown in FIG. 10, the improved unit cell 1000 includes two transistor device units, 1002-L and 1002-R, which are similar to the transistor device unit 700 described with reference to FIG. 7. Each of the transistor device units 1002-L and 1002-R includes two sub-units 1012 and 1014. Each of the sub-units 1012 and 1014 are coupled to drain nodes 1002-DN, source nodes 1002-SN, first gate nodes 1002-GN1, second gate nodes 1002-GN2, and third gate nodes 1002-GN3. A first electrode of a capacitor 1004-C1 is coupled to the source nodes 1002-SN. A second electrode of the capacitor 1004-C1 is coupled to the second gate nodes 1002-GN2. A first electrode of a capacitor 1004-C2 is coupled to the source nodes 1002-SN. A second electrode of the capacitor 1004-C2 is coupled to the third gate nodes 1002-GN3. The source nodes 1002-SN, drain nodes 1002-DN, first gate nodes 1002-GN1, second gate nodes 1002-GN2, and third gate nodes 1002-GN3 may each be coupled to buses (not shown) that convey signal and/or bias voltages.

Figure 11:
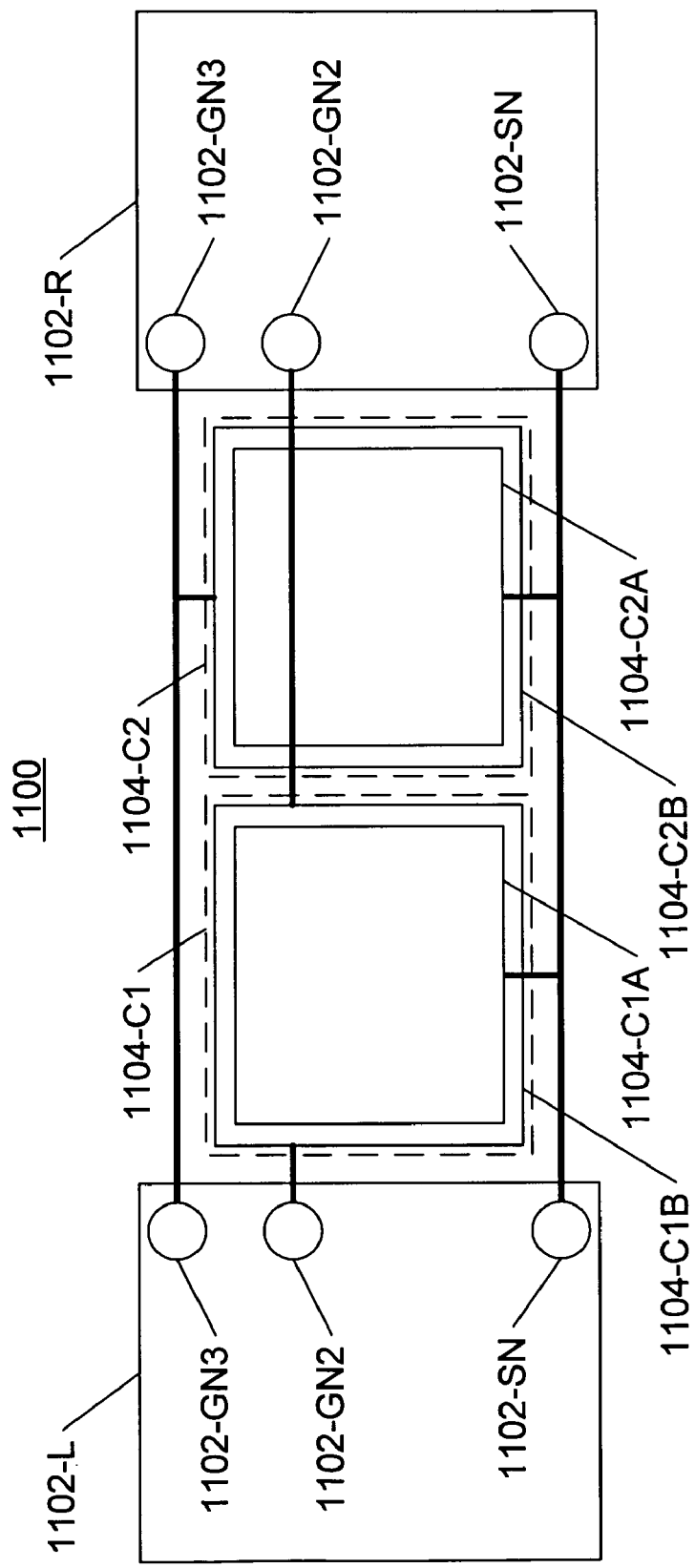
FIG. 11 is a block diagram showing a layout of a unit cell, in accordance with the unit cell of FIG. 10.

FIG. 11 is a block diagram that illustrates an exemplary layout of an improved unit cell 1100 corresponding to the improved unit cell 1000 of FIG. 10. Transistor device units 1102-L and 1102-R include circuit components corresponding to the circuit components included in the transistor device units 1002-L and 1002-R of FIG. 10. Those skilled in the IC design arts will appreciate how the transistor device units 1002-L and 1002-R may be implemented, in light of the teachings herein. Capacitors 1104-C1 and 1104-C2 are disposed between the transistor device units 1102-L and 1102-R. A first electrode 1104-C1A of the capacitor 1104-C1 is coupled source nodes 1102-SN. A second electrode 1104-C1B of the capacitor 1104-C1 is coupled to second gate nodes 1102-GN2. A first electrode 1104-C2A of the capacitor 1104-C2 is coupled to the source nodes 1102-SN. A second electrode 1104-C2B of the capacitor 1104-C2 is coupled to the third gate nodes 1102-GN3.

Improved IC Layouts

Figure 12:
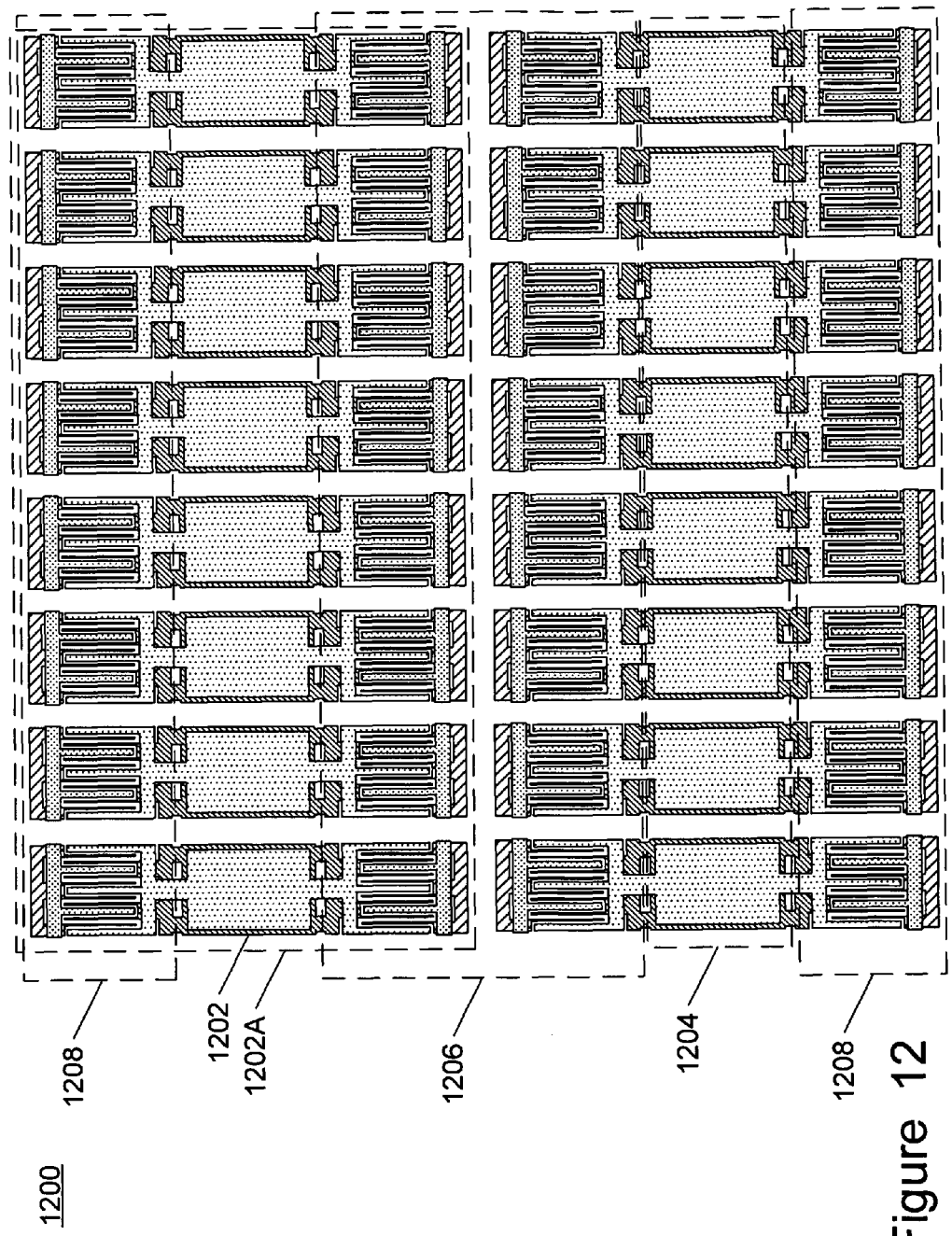
FIG. 12 illustrates a layout of an area of an improved power amplifier integrated circuit made in accordance with the present teachings.

A significant advantage of the improved unit cell of the present disclosure as compared with the prior art approaches is that it enables improved IC layouts for RF power amplifiers. FIG. 12 illustrates one embodiment of an array 1200 of an improved IC layout according to the present teachings. An improved unit cell 1202 is replicated in the two dimensional array 1200. The two dimensional array 1200 includes two linear arrays 1202A (for clarity, only the top linear array 1202A is labeled), wherein each linear array 1202A includes 8 replications of the improved unit cell 1202. The improved unit cell 1202 is equivalent to the improved unit cell 800 described above with reference to FIG. 8. Those skilled in the IC design and fabrication arts will understand that a single linear array or an arbitrary plurality of linear arrays of unit cells may be juxtaposed according to the present teachings. Likewise, an arbitrary plurality of units cells may be included in each linear array. The beginning and end points of the linear arrays need not coincide. An advantage of the array 1200 is that transistor device units 1206 are separated from transistor device units 1208 by capacitors 1206. This provides an increased area for heat dissipation wherein heat is generated in the transistor device units. The area for heat dissipation is greater than what would be possible if capacitors 1206 were not included in the replications of the improved unit cell 1202.

Figure 13:
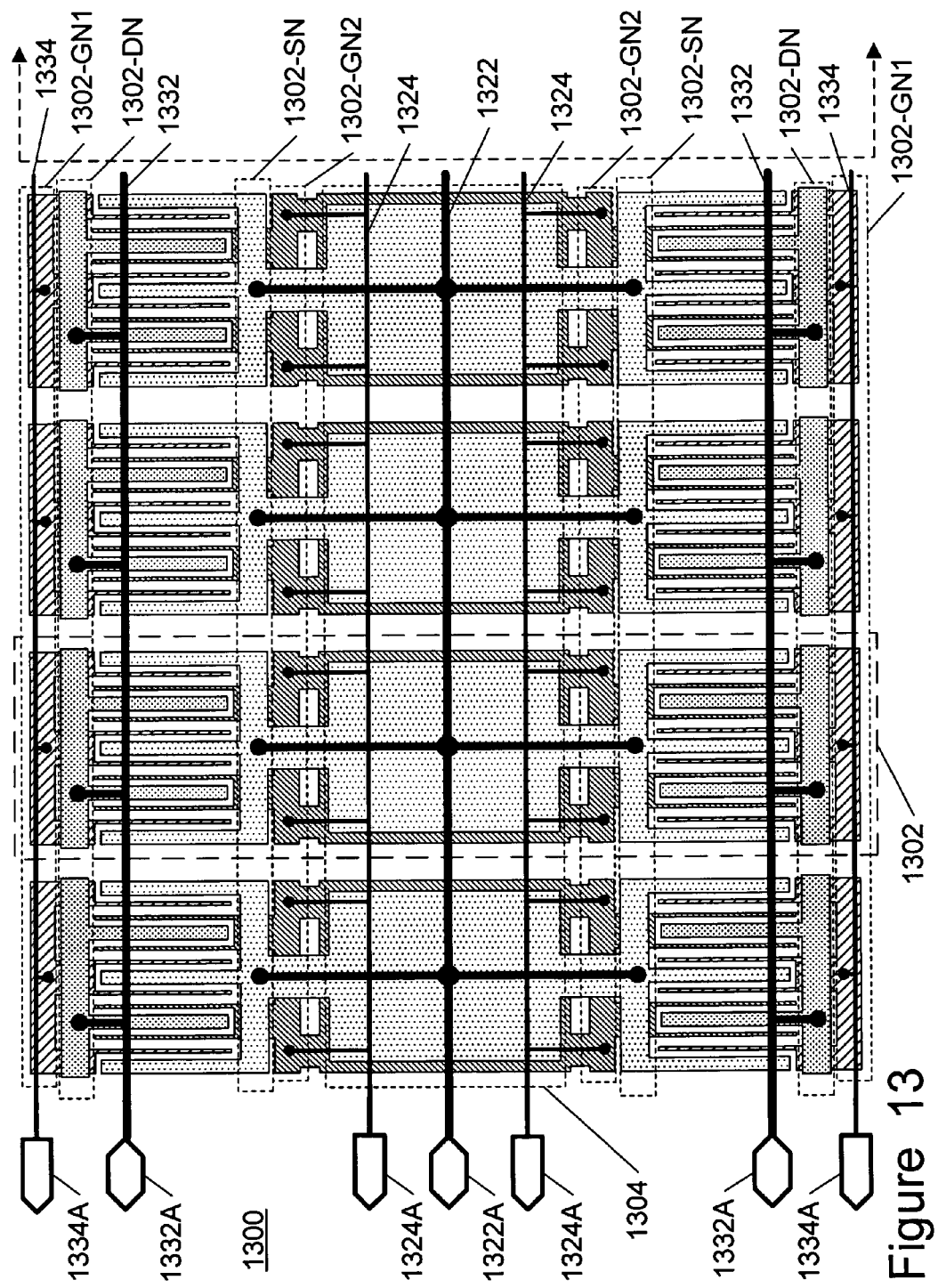
FIG. 13 illustrates a disposition of bus lines for conveying signal and bias voltages in accordance with the layout of FIG. 12.

FIG. 13 illustrates an exemplary disposition of bus lines for conveying signal and bias voltages to an array 1300 of improved unit cells 1302. For clarity, only a portion of one linear array is shown, including four replications of the improved unit cell 1302. A source bus 1322 conveys signal voltages and/or bias voltages (for cascode circuits, the source bus typically conveys ground potential) from a source bus terminal 1322A to source nodes 1302-SN. Two drain buses 1332 convey signal and/or bias voltages from drain bus terminals 1332A to drain nodes 1302-DN. A first two gate buses 1334 convey signal and/or bias voltages from gate bus terminals 1334A to first gate nodes 1302-GN1. A second two gate buses 1324 convey signal and/or bias voltages from gate bus terminals 1324A to second gate nodes 1302-GN2. The improved unit cells include capacitors 1304, coupled to source nodes 1302-SN and gate nodes 1302-GN2, as described above in reference to like components illustrated in FIG. 8.

The disposition of the bus lines illustrated in FIG. 13 provides significant advantages over prior art designs. First, because the capacitors 1304 are disposed between and proximate the source nodes 1302-SN and the gate nodes 1302-GN2, a bus is not required to provide coupling to the capacitors 1304. This is an advantage over the prior art designs as described in reference to FIGS. 1 and 2. This aspect of the present disclosure provides significant improvements in power-added efficiency for RF PA ICs. Second, the source bus 1322 may be disposed on top of the capacitors 1304. In some embodiments, the source bus 1322 may be implemented as a thick metal cap plate that covers the capacitors 1304, thereby providing a very low-resistance coupling between a ground potential and the source nodes 1302-SN. Third, the second two gate buses 1324 may be disposed on the bottom of the capacitors 1304 (e.g., coplanar with the lower electrodes of the capacitors), to reduce parasitic coupling between the buses 1324 and other circuit elements. Fourth, the drain buses 1332A may be disposed over the transistor areas (e.g., the area 610 of FIG. 6) of the improved unit cells in order to reduce the parasitic capacitance between the drain buses 1332A and gate nodes 1302-G1. And fifth, because the first two gate buses 1334 are better isolated from the drain buses 1332A, the first two gate buses may be fabricated using wider metal layers with lower resistances than would otherwise be possible.

Figure 14:
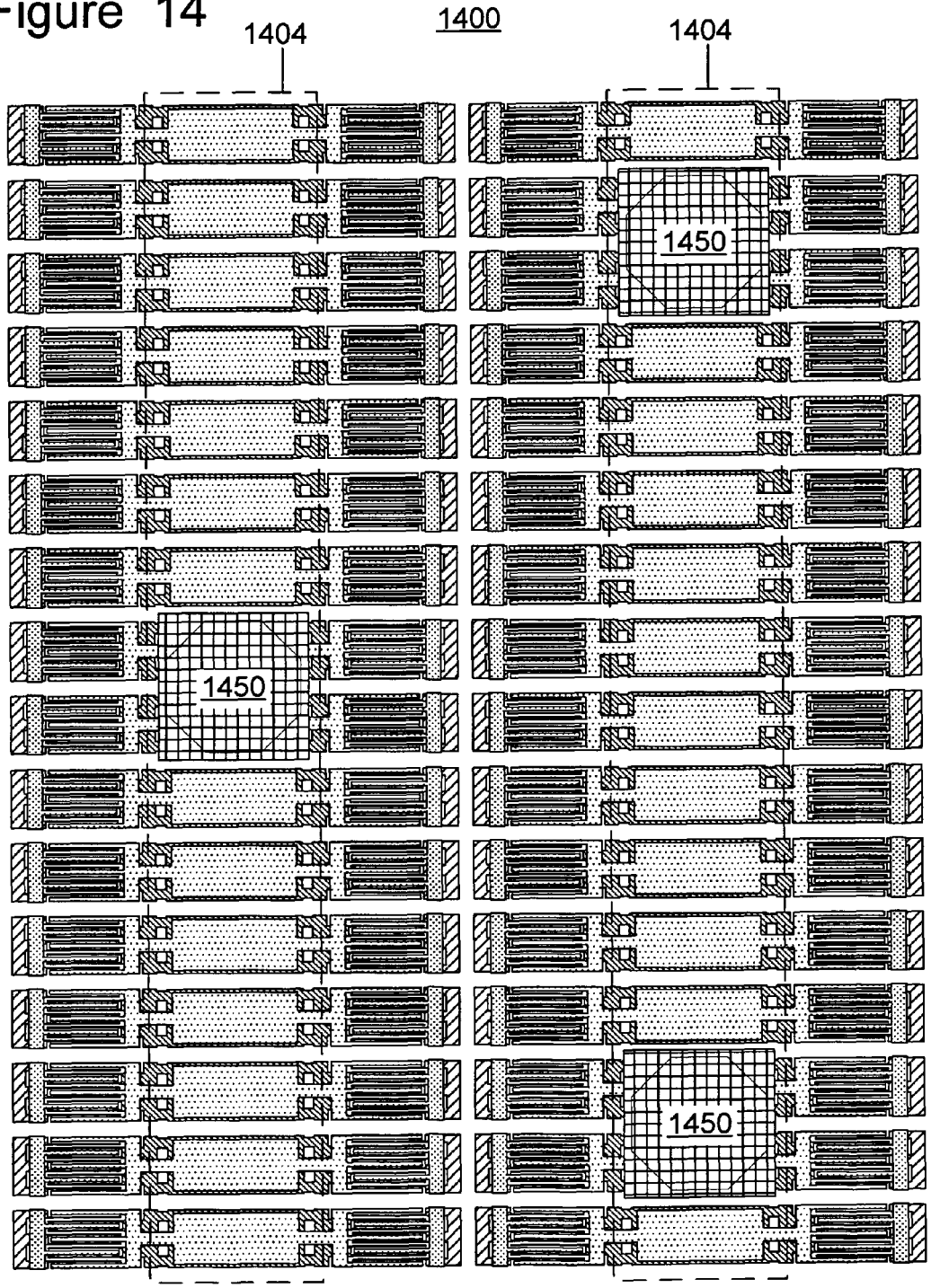
FIG. 14 illustrates a layout of an area of an improved power amplifier integrated circuit, showing a disposition of contact pads in accordance with the present teachings.

Another advantage of the improved IC layout configurations according the present disclosure is that contact pads may be disposed proximate to the heat-producing transistor device units. Contact pads may be used to remove heat that is generated by the transistor device units. Contact pads may also convey signal and/or bias voltages to and from buses and/or transistor device units. Optionally, contact pads may be disposed directly above capacitors. In some embodiments, contact pads may be disposed in regions proximate to or within the unit cells. In some embodiments, the contact pads may be disposed between linear arrays of TDUs, as shown in FIG. 14, described hereinbelow. In some embodiments the contact pads may be contiguous with the IC semiconductor layer, with metal layers, with insulating layers, with the substrate or with other structures, according to methods well-known to persons skilled in the IC fabrication arts. Placing contact pads over the transistor device units would cause undesirable parasitic capacitance between transistor components. Because the potential of the upper electrode of the capacitors is typically a uniform ground potential, parasitic capacitance induced by proximity to contacts pads does not cause a problem according to the present teachings. An exemplary embodiment illustrating this aspect of the present teachings is illustrated by FIG. 14. An array 1400 (similar to the array 1200 described in reference to the FIG. 12) includes a plurality of contact pads 1450. The contact pads 1450 are disposed within regions 1404 which are also occupied by linear arrays of capacitors as shown in FIG. 14. Optionally, the contact pads 1450 are placed on an insulating layer (not shown) that provides electrical isolation from the capacitors and buses (not shown), according to methods well-known to persons skilled in the IC fabrication arts. In other embodiments, the contact pads 1450 may be disposed contiguous with the substrate, over a bus and/or a contact node (e.g., a gate bus and/or gate contact node, not shown), or over other structures. The contact pads 1450 may be operably coupled to buses (not shown) in order to convey signal voltages and/or bias voltages.

In some embodiments, the contact pads 1450 may be used only for the purpose of heat dissipation. In other embodiments, the contact pads 1450 may convey both heat and electrical signals and/or bias voltages. In some embodiments, the contact pads 1450 may be contacted using wire bonds. In other embodiments, the contact pads 1450 may be contacted by flip chip mounting using solder bumps, gold balls or Cu pillars. Placing contact pads within the arrays may be particularly beneficial for flip chip mounting because of limited ability to remove heat through the back of the flip chip. Methods for fabricating the contact pads 1450, and for contacting the contact pads 1450 via wire bonds or flip chip mounting, are well known to persons skilled in the arts of IC fabrication and chip mounting.

Method for Amplifying RF Signals in Accordance with the Present Teachings

Figure 15:
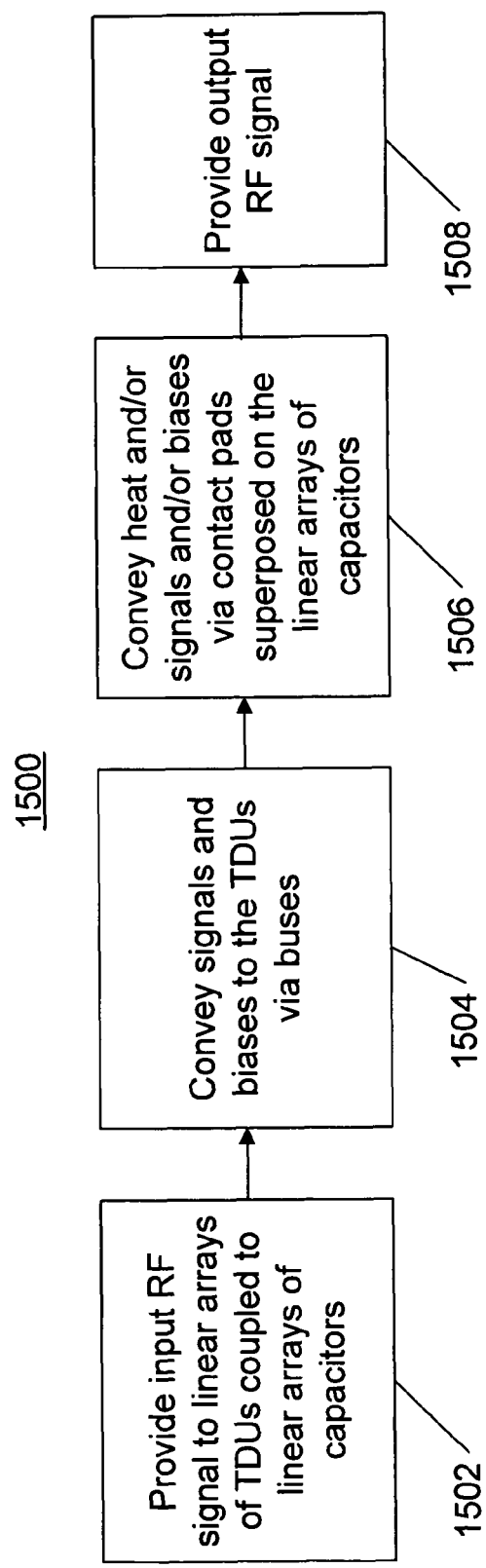
FIG. 15 is a flowchart of a method of amplifying RF signals in accordance with the present teachings.

An embodiment of a method 1500 for amplifying RF signals is illustrated by the flow-chart diagram of FIG. 15. The method 1500 begins at a STEP 1502 wherein an input RF signal is provided to one or more linear arrays of transistor devices units (TDUs) that are operably coupled to one or more linear arrays of capacitors. The linear arrays of TDUs and the linear arrays of capacitors are components of an improved RF PA IC in accordance with the present disclosure, operably coupled together as described hereinabove (e.g., as described above with reference to FIGS. 9, 13 and 14). In an example of the STEP 1502, the input RF signal may be provided to the gate nodes 902-GN1 of the TDUs 902-L and 902-R of FIG. 9. In a similar example, the input RF signal may be provided to the gate nodes 1302-GN1 via the buses 1334 from the contacts 1334A of FIG. 13.

At a STEP 1504, which is executed in some embodiments concurrently with the STEP 1502, the method 1500 conveys signals and bias voltages via buses that are operably coupled to the linear arrays of the TDUs and the linear arrays of capacitors. For example, referring to FIG. 13, the input RF signal and a first gate bias may be conveyed to the gate nodes 1302-GN1 by the gate buses 1334; a source bias (e.g., ground potential) may be conveyed to the source nodes 1302-SN by the source bus 1322; a second gate bias may be conveyed to the gate nodes 1302-GN2 by the gate buses 1324; and, a drain bias and an output RF signal may be conveyed by the drain buses 1332 that are operably coupled to the drain nodes 1302-DN. As shown in FIG. 15, the method 1500 proceeds to a STEP 1506.

At the STEP 1506, heat and/or signals and/or biases are conveyed to and/or from the TDUs by contact pads that are disposed on or within the linear arrays of capacitors (e.g., the contact pads 1450 of FIG. 14). In some embodiments, the contact pads may be disposed in areas that are outside the linear arrays of TDUs and the linear arrays of capacitors. At a final STEP 1508 an output RF signal is provided. In an example of the STEP 1508, the output RF signal may be provided by the drain nodes 902-DN of the TDUs 902-L and 902-R of FIG. 9. In a similar example, the input RF signal is provided to the contacts 1332A via the buses 1332 by the drain nodes 1102-DN.

Methods of Fabrication in Accordance with the Present Teachings

In one embodiment of the present teachings, the exemplary circuits described above are implemented using a high-resistivity (e.g., resistivity >10 ohm-cm) substrate silicon-on-insulator (SOI) technology. The high-resistivity substrate enhances the performance characteristics of RF transistors and ICs by reducing the deleterious substrate coupling effects associated with low-resistivity substrates. For example, improvements in insertion loss are realized by lowering the transistor ON-state resistances and by reducing parasitic substrate conductances and capacitances. In addition, transistor isolation is improved using the high-resistivity SOI substrates. Owing to the high-resistivity nature of SOI technology, the parasitic capacitance between the nodes of the RF transistors are greatly reduced as compared with bulk semiconductor technologies, and other traditional integrated circuit manufacturing technologies.

As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In one embodiment, the inventive RF PA of the present disclosure is fabricated on a sapphire substrate.

Fabrication of devices on an insulating substrate requires that an effective method for forming silicon devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, whereby inter-device leakage through the substrate is reduced.

An "ideal" SOI wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950 degrees C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some embodiments of the present disclosure, the MOS transistors may be formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating silicon-on-sapphire integrated circuits can be used without departing from the spirit or scope of the present teachings.

A number of embodiments of the present inventive concept have been described. Nevertheless, it will be understood that various modifications may be made without departing from the scope of the inventive teachings. For example, it should be understood that the functions described as being part of one module may in general be performed equivalently in another module.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. An RF power amplifier integrated circuit, comprising:
   a) a plurality of linear arrays of transistor device units, wherein each transistor device unit comprises at least one source node and at least one first gate node;
   b) at least one source bus, wherein the at least one source bus is operably coupled to the at least one source node of each transistor device unit;
   c) at least one first gate bus, wherein the at least one first gate bus is operably coupled to the at least one first gate node of each transistor device unit; and,
   d) a least one linear array of capacitors, wherein a first electrode of each of the capacitors is operably coupled to the at least one source bus, and wherein a second electrode of each of the capacitors is operably coupled to the at least one first gate bus, and wherein the at least one linear array of capacitors is disposed between two of the linear arrays of transistor device units.

2. The RF power amplifier integrated circuit of claim 1, further comprising unit cells, wherein each of the unit cells comprises a plurality of the transistor device units and at least one of the capacitors, and wherein the at least one of the capacitors is disposed between and operably coupled to at least two of the transistor device units.

3. The RF power amplifier integrated circuit of claim 1, wherein the transistor device units comprise a plurality of transistor sub-units operably coupled together, and wherein each sub-unit comprises a plurality of transistors operably coupled together.

4. The RF power amplifier integrated circuit of claim 1, wherein the transistor device units comprise at least one interdigitated transistor.

5. The RF power amplifier integrated circuit of claim 4, wherein the at least one interdigitated transistor comprises:
    a) a source contact;
    b) a drain contact; and,
    c) two interdigitated gate contacts disposed between the source contact and the drain contact.

6. The RF power amplifier integrated circuit of claim 1, wherein the at least one source bus is disposed on top of the at least one linear array of capacitors.

7. The RF power amplifier integrated circuit of claim 6, wherein the at least one source bus comprises a metal layer.

8. The RF power amplifier integrated circuit of claim 1, wherein the at least one first gate bus is disposed on the bottom of the at the least one linear array of capacitors.

9. The RF power amplifier integrated circuit of claim 1, further comprising at least one drain bus, and wherein the transistor device units comprise at least one drain node, and wherein the least one drain bus is operably coupled to the at least one drain node and is disposed on top of at least one of the linear arrays of transistor device units.

10. The RF power amplifier integrated circuit of claim 2, further comprising at least one second gate bus, and wherein the unit cells comprise at least one second gate node operably coupled to the at least one second gate bus, and wherein the at least one second gate bus is not electrically coupled to the capacitors, and wherein the at least one second gate bus is disposed between two linear arrays of the unit cells.

11. The RF power amplifier integrated circuit of claim 1, further comprising at least one contact pad, wherein the at least one contact pad is coupled to the RF power amplifier integrated circuit to convey heat generated by the transistor device units, and wherein the at least one contact pad is disposed between two linear arrays of the transistor device units.

12. The RF power amplifier integrated circuit of claim 11, wherein a method for contacting the at least one contact pad is selected from the following methods: a wire bonding method and a flip-chip mounting method.

13. The RF power amplifier integrated circuit of claim 12, wherein the flip-chip mounting method comprises at least one the following: solder bumps, gold balls, and Cu pillars.

14. The RF power amplifier integrated circuit of claim 1, wherein the capacitors comprise at least one of the following capacitor types: metal-insulator-metal capacitors, metal-oxide-semiconductor capacitors, and vertical native capacitors.

15. The RF power amplifier integrated circuit of claim 1, wherein the integrated circuit is fabricated on a substrate having a resistivity greater than 10 ohm-cm.

16. The RF power amplifier integrated circuit of claim 1, wherein the integrated circuit is fabricated on a substrate selected from the following substrates: silicon-on-sapphire, SIMOX, and silicon-on-glass.

17. A method for amplifying RF signals, comprising the steps of:
    a) providing an input RF signal to an input bus operably coupled to input nodes of a plurality of linear arrays of transistor device units, wherein two linear arrays of the transistor device units are operably coupled to at least one linear array of the capacitors, and wherein the at least one linear array of capacitors is disposed between two of the linear arrays of transistor device units; and,
    b) providing an output RF signal via an output bus operably coupled to output nodes of the two linear arrays of transistor device units.

18. The method of claim 17, further comprising the step of removing heat from the vicinity of the transistor device units via at least one contact pad, wherein the at least one contact pad is disposed in a region between the two linear arrays of transistor device units, and is operably coupled to the region between the two linear arrays of transistor device units in order to convey heat generated by the transistor device units.

19. The method of claim 18, wherein a method for contacting the at least one contact pad is selected from the following methods: a wire bonding method and a flip-chip mounting method.

20. The method of claim 19, wherein the flip-chip mounting method comprises at least one the following: solder bumps, gold balls, and Cu pillars.

21. A unit cell for use in implementing an RF power amplifier integrated circuit, comprising:
    at least two transistor device units (TDUs), wherein the TDUs comprise a plurality of transistor sub-units, and wherein the transistor sub-units include at least two transistors coupled together in a series configuration, and wherein the at least two TDUs comprise source nodes (SN) and gate nodes (GN) coupled to the sources and drains of the at least two transistors; and
    a coupling capacitor disposed between the at least two TDUs, wherein the coupling capacitor has a first electrode and a second electrode disposed on opposite sides of the coupling capacitor, and wherein the first electrode is coupled to the source nodes (SN) and wherein the second electrode is coupled to the gate nodes (GN).

22. The unit cell of claim 21, wherein the unit cell comprises three or more TDUs coupled together in series, and wherein the TDUs are coupled to a selected number of coupling capacitors, wherein the coupling capacitors are coupled in a parallel configuration, and wherein first electrodes of the coupling capacitors are coupled to the source nodes (SN) and wherein second electrodes of the coupling capacitors are coupled to the gate nodes (GN).

23. The unit cell of claim 21, wherein the sub-units are coupled together in one of the following possible electrical configurations: a parallel configuration; a serial configuration; or as a combination of both parallel and serial configurations.

24. The unit cell of claim 21, wherein the TDUs comprise interdigitated transistor devices.

25. The unit cell of claim 21, wherein the sub-units comprise interdigitated transistor devices.

* * * * *